US007379003B2

(12) United States Patent
Chuang et al.

(10) Patent No.: US 7,379,003 B2
(45) Date of Patent: May 27, 2008

(54) MULTI-CHANNEL DISPLAY DRIVER CIRCUIT INCORPORATING MODIFIED D/A CONVERTERS

(75) Inventors: Yu-Chun Chuang, Miaoli Hsien (TW); Fu-Jen Shih, Kaohsiung (TW); Cheng-Han Hsieh, Chupei (TW); Hsu-Yuan Chin, Fengshan (TW)

(73) Assignee: Silicon Touch Technology Inc., Hsinchu (TW)

( * ) Notice: Subject to any disclaimer, the term of this patent is extended or adjusted under 35 U.S.C. 154(b) by 313 days.

(21) Appl. No.: 10/987,575

(22) Filed: Nov. 12, 2004

(65) Prior Publication Data

US 2005/0156918 A1 Jul. 21, 2005

(30) Foreign Application Priority Data

Nov. 13, 2003 (TW) .............................. 92131743 A

(51) Int. Cl.
*H03M 1/66* (2006.01)
*H03M 1/82* (2006.01)

(52) U.S. Cl. ....................... 341/144; 345/102; 341/152

(58) Field of Classification Search ................ 341/144, 341/152; 345/8, 102, 63
See application file for complete search history.

(56) References Cited

U.S. PATENT DOCUMENTS

| | | | | |
|---|---|---|---|---|
| 5,455,681 | A * | 10/1995 | Ng | 358/3.01 |
| 6,067,066 | A * | 5/2000 | Kubota et al. | 345/98 |
| 6,169,505 | B1 * | 1/2001 | Nishimura et al. | 341/141 |
| 6,441,829 | B1 * | 8/2002 | Blalock et al. | 345/690 |
| 7,099,056 | B1 * | 8/2006 | Kindt | 358/509 |
| 2002/0084957 | A1 * | 7/2002 | Fisekovic | 345/63 |

* cited by examiner

*Primary Examiner*—Peguy JeanPierre
(74) *Attorney, Agent, or Firm*—Jianq Chyun IP Office

(57) ABSTRACT

A multi-channel display driver circuit incorporating modified D/A converters has a plurality of digital comparators connected to a number generator. Each digital comparator has an output, a digital data input and a reference input. The reference inputs of all digital comparators are connected to the number generator and the outputs are respectively connected to corresponding data channels of a display. By the proposed technique, each digital comparator obtains a unique non-sequence reference signal, and then compares it with the input digital data signal. Since the non-sequential signals are input to the reference input of the digital comparator, the overshoot distortion, the harmonic distortion and the electromagnetic interference problems are prevented. Therefore, the precise imaging can be obtained with this signal modulation technique in small circuit size.

7 Claims, 15 Drawing Sheets

TIME-DOMAIN SIGNAL WAVEFORM (RANDOM 512/1024)

TIME-DOMAIN SIGNAL WAVEFORM (RANDOM 299/1024)

TIME-DOMAIN SIGNAL WAVEFORM (SIGMA-DELTA 512/1024)

TIME-DOMAIN SIGNAL WAVEFORM (SIGMA-DELTA 299/1024)

MULTI-CHANNEL DISPLAY DRIVER CIRCUIT INCORPORATING MODIFIED D/A CONVERTERS

BACKGROUND OF THE INVENTION

1. Field of the Invention

The present invention is related to a multi-channel display driver circuit incorporating modified digital-to-analog (D/A) converters and, more particularly, to a modified pulse width modulated D/A converter circuit to convert input digital signals to analog output for data imaging on the display apparatus, capable of overcoming harmonic distortion and electromagnetic interference, that occur in a display driver circuit using conventional pulse width modulation digital-to-analog converters.

2. Description of Related Art

The so-called digital display actually draws on the various technologies from electro-optics, electronics, biochemistry, and semiconductor domains. A multi-channel display driver is an important component in the new generation of display apparatuses used to control simultaneous output of video data.

In recent years, different multi-channel display driver circuits have been devised by many manufacturers of digital displays to meet requirements for high speed display and to downsize the circuit components.

For conventional multi-channel display driver circuits, in an effort to downsize the circuit components, manufacturers often use pulse width modulated (PWM) digital-to-analog (D/A) converters in the display driver circuit. The architecture of a conventional PWM D/A converter circuit is shown in FIG. 8, comprising:

a sequential counter (41), either an up counter or a down counter, which outputs a sequence signal, which is represented by a given number of bits (n bits) which is the same as the number of bits of a digital data signal received by the D/A converter; and a plurality of parallel digital comparators (40), wherein the outputs of the digital comparators are, respectlvely, connected to a corresponding data channel of a display apparatus (42) in parallel, and each digital comparator (40) has a digital data input and a reference input, wherein the reference input is connected to the sequential counter (41) to obtain a sequence signal as a reference signal of the digital comparator (40).

The reference inputs of all digital comparators (40) in the PWM D/A converter circuit are connected to the sequential counter (41) with the same sequence of bits (0-bit~n-bit) as shown in FIG. 9, so that all digital comparators (40) use the same reference signals. These reference signals are to be compared with the input digital data signals. If the value of input digital data signal is greater than or equal to that of the reference signal, then the digital comparator (40) will output a high voltage pulse, and if the value of input data digital signal is smaller than that of the reference signal, the digital comparator (40) will output a low voltage pulse.

In FIGS. 10A and 10B, two different waveforms of the output signals are generated from the digital comparator using two different digital data signals in a given time period. If the sequential counter (41) overflows, the sequential counter (41) will be reset to start all over again, and the output of a digital comparator (40) normally terminates at the end of a complete output cycle period. For example using a 10-bit sequential counter, when the sequential counter (41) output sequence signal's value reaches 1024, the sequential counter (41) is reset to start the next output cycle period. The bit-length of each output cycle period is dependent on the number of bits contained in the output of the sequential counter (41) and the clock rate driving the sequential counter (41).

The above PWM D/A converter circuit mainly consists of one sequential counter (41) and the plurality of digital comparators (40). Therefore, a multi-channel display driver using this type of D/A converter can be built with a small-size circuit and low costs, but these D/A converters have the following disadvantages:

1. If the output signal of pulse width modulation is sustained for a given time period short of a complete output cycle, the sampled analog signal waveform will tend to concentrate towards either high voltage or low voltage side, thus causing the overshoot distortion of the DC level.

2. Flickering will appear on the display apparatus when low order harmonics of pulse width modulated signals are produced.

The flickering phenomenon will further worsen if the number of bits in a digital data signal is extended. This is because the output cycle period of a pulse width modulated signal also has to be extended to cover the extra bits, and the effect of a longer duty cycle will multiply during line scanning, leading to even more serious harmonic distortion and flickering.

For example, if the input digital signal and the counter both are 10 bits, the output signal shall be stored with a normal cycle period of $1024(2^{10}=1024)$ clocks. If the cycle period of output signal is extended, provided that the clock rate is constant, then the frame rate has to be reduced in inverse proportion. Once the frame rate or screen refresh rate drops to a level that human eyes are able to detect, flickering will appear on the display apparatus. Therefore, the conventional PWM D/A converter circuit is susceptible to low frequency harmonics, and as a result, the imaging quality will be degraded. This harmonic distortion phenomenon happens since the sequential counter outputs sequence signals. Therefore, the PWM D/A converter couldn't provide a quality image output although it's size is small.

Another D/A converter circuit that uses sigma-delta modulation technique can produce good images. This sigma-delta D/A converter circuit, as shown in FIG. 11, is formed by a plurality of parallel sigma-delta converters (50). Each, sigma-delta converter (DAC) (50), as shown in FIG. 12, mainly consists of an adder (51), a loop filter (52) and a quantizer (53). One input of the adder (51) is used for receiving digital signal input (Digital In), and another input is used to receive the output fed from the quantizer (53), thus forming a feedback loop (54).

The adder (51) in the sigma-delta converter (50) uses the signal fed back by the quantizer (53) to subtract from the digital signal to produce an error signal (Es). Then, the error signal (Es) is sampled and again input through the feedback loop (54), where the error signal (Es) is synthesized with subsequent input and then forwarded to the quantizer (53) again through the loop filter (52). As the value of the error signal (Es) represents the difference between the quantized signal and the digital signal, the returned error value through the sigma-delta loop (54) can correct the previous quantizing error to make the output from the quantizer (53) of sigma-delta converter (50) free from first harmonics.

In FIGS. 13A, B, from the time-domain signal waveform of two different outputs from the sigma-delta converter, high (512/1024) and low (299/1024) DC levels are dispersed across a given time period. It can be clearly seen that the average DC magnitude of the output in FIG. 13A is greater than that of FIG. 13B (512>299), as the time-domain signal waveform of FIG. 13A is more concentrated than that of FIG. 13B. When these two signals are output to the display apparatus, the image produced by the output of FIG. 13A will be brighter than that of FIG. 13B. From the output time-domain signal waveforms of the sigma-delta converter, it can also be observed that the sampled analog signal waveform from the output of the sigma-delta converter does not have to rely on a complete output cycle period to produce precise DC levels, and yet the summation of sampled high and low levels can closely approximate the target output value. Therefore, overshoot distortion of the DC level will never occur using the sigma-delta modulation technique.

In FIGS. 14A and 14 B, from the comparative frequency spectrum of the output from the sigma-delta converter and the PWM D/A converter, it is apparent that the operation of the sigma-delta converter circuit can completely remove the first harmonics due to the reasons already explained in the above paragraph.

Though the above sigma-delta D/A converter circuit produces better results than the PWM D/A converter circuit, the construction of each sigma-delta converter is more complicated. Besides, if the sigma-delta D/A converter circuit is to be applied in a multi-channel data driver, a matching number of sigma-delta converters for multiple data channels will be required. Therefore, the sigma-delta D/A converter circuit will take up more circuit space than the equivalent PWM D/A converter circuit.

The current situation is that D/A converters in multi-channel display driver circuits cannot be downsized and still have good performance, no matter which signal modulation technique is used.

SUMMARY OF THE INVENTION

The main objective of the present invention is to provide a modified pulse width modulated (PWM) D/A converter circuit, capable of correcting the overshoot distortion of the DC level and harmonic distortion to produce precise images on the display apparatus.

The second objective of the present invention is to provide a modified D/A converter circuit that is able to operate without electromagnetic interference.

The third objective of the present invention is to provide a modified D/A converter that can be built into the multi-channel display driver circuit with a relatively small size.

To this end, the modified D/A converter circuit in accordance with the invention comprises a plurality of digital comparators each of which has a digital data input, a reference input with multiple bit lines, and an output connected to a corresponding data channel of a display apparatus; and a number generator for outputting non-sequential reference signals to the reference input of each digital comparators, wherein the number generator has an output with multiple bit lines so the non-sequential reference signal is represented by the multiple bit lines.

The number generator is a random number generator or a sequential counter to generate non-sequence reference signals. The non-sequence reference signals are sent to the reference input of each digital comparator. The digital comparator uses the non-sequence reference signals to compare with the digital data signals to generate an output signal with pulses, which are dispersed in a given time period.

The quantity of digital comparators is equal to the quantity of data channels available on the display apparatus for a one-on-one match. The reference input and the digital data input of the digital comparator have the same number of bits.

According to the first aspect of the present invention, as the reference signals to the digital comparator are random or non-sequential signals, the modified D/A converter generates the output signal with randomly dispersed pulses. The output signal formed of a sampled analog signal and closely approximate the target value as the high and low DC levels of the analog signals are more evenly distributed throughout a given time period. The output signals of digital comparators will be moderated from the extreme values in each time period, such that the abnormal phenomenon where the high or low DC levels are over-concentrated in either the first half or the second half of the output cycle is eliminated. Thus, the overshoot distortion of DC level is improved, whereas in the conventional PWM D/A converter circuit overshoot distortion of DC level occurs when the analog signal waveform is not sampled from the output signal of a complete output cycle.

Therefore, the output signal of digital comparators may be sampled with any time period, irrespective of output cycle, and yet the summation of sampled high and low levels still can closely approximate the target output value. If the actual output value is divided by the target output value, the ratio will be close to the ideal value (ideal rate=1.0). Therefore, the overshoot distortion of DC level, if any, shall be far less in the present invention than using the conventional pulse width modulation (PWM) technique.

Moreover, as the output signal dispersed, the effect of first harmonics and flickering on the display screen can be greatly reduced.

According to the second aspect of the present invention, if all digital comparators are connected to the number generator, all digital comparators will obtain the same reference signals. Therefore, when multiple bit lines of the digital comparator are switched simultaneously, the parasitic inductance collected from adjacent bit lines will produce a surge current that can give rise to considerable amount of electromagnetic interference detrimental to the operation of components. In the present invention, the random number generator or the sequential counter is connected to each digital comparator through the bit lines non-sequentially, whereby all digital comparators will obtain a unique reference signal derived therefrom in the same time period. Therefore, the chance of simultaneous switching of the digital comparators is considerably reduced and the D/A converter circuit operates without electromagnetic interference.

According to the third aspect of the present invention, these digital comparators are connected to a random number generator or a sequential counter. Thus, a simple architecture like a conventional PWM D/A converter circuit can be retained.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
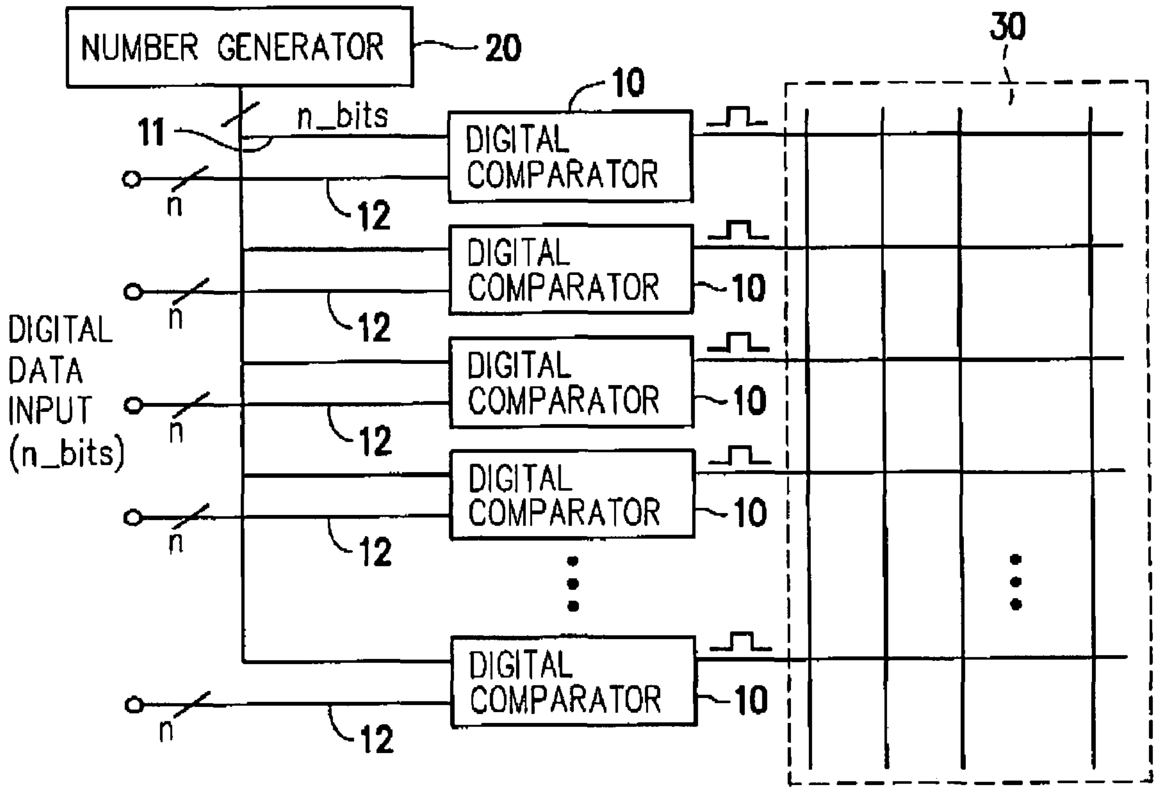
FIG. 1 is a block diagram of the system architecture of the first preferred embodiment of the present invention.

The present invention provides a multi-channel display driver circuit incorporating modified PWM D/A converters, having the advantages of high quality of imaging, relatively small size, simple architecture and low costs. With reference to FIG. 1, the present invention comprises:

a plurality of digital comparators (10) each has an output being connected to a corresponding data channel of a display apparatus (30), and each has a digital data input (12) and a reference input (11) with multiple bit lines, wherein the quantity of the bit lines of the reference input (11) is the same as that of the digital data input (12), and the bit lines are designated in sequential order from the lowest bit (LSB) to the highest bit (MSB); and a number generator (20) connected to the reference input (11) of each digital comparator (10) for generating non-sequential reference signals.

The number generator (20) has an output with plural output bit lines, wherein the plural output bit lines are connected to the bit lines of the reference input (11) of each digital comparator (10) and may be connected sequentially or non-sequentially. The number generator (20) can be a device capable of generating random numbers or can be a combination of a random number generator and a sequential counter to provide less significant bits.

Figure 2:
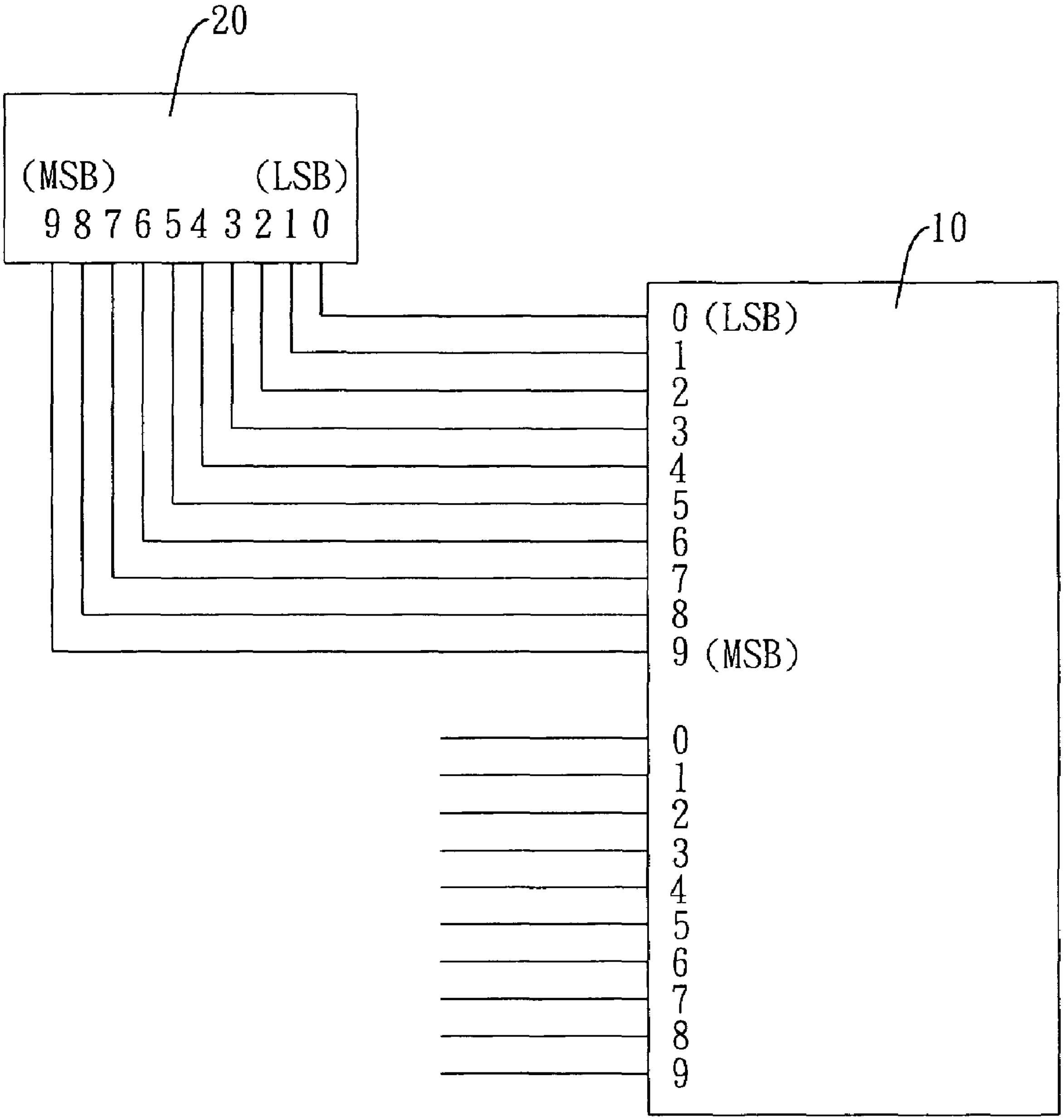
FIG. 2 shows the bit line connections from the output of the random number generator to the reference input of each digital comparator shown in FIG. 1.

In the detailed illustration of a digital comparator (10) shown in FIG. 2, the output of the number generator (20) is connected to each digital comparator (10) through the bit lines, and the bit lines are arranged in sequential order from the lowest to the highest.

Each digital comparator (10) is used to compare the reference signal output from the number generator (20) with the digital data signal to generate an output signal with pulses. With reference to FIGS. 6 A and 6 B, the two different waveforms of the output signals are generated by the same digital comparator (10) in a given time period while using two digital data signals with different DC magnitudes.

Figure 6A:
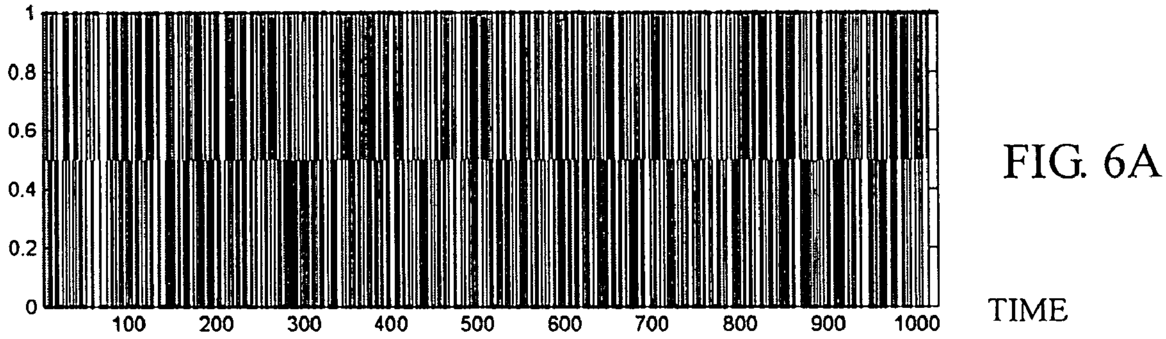
FIGS. 6A and 6B respectively show the time domain waveform of two output signals output from the digital comparator using two different digital data signals input into the modified PWM D/A converter.
Figure 6B:
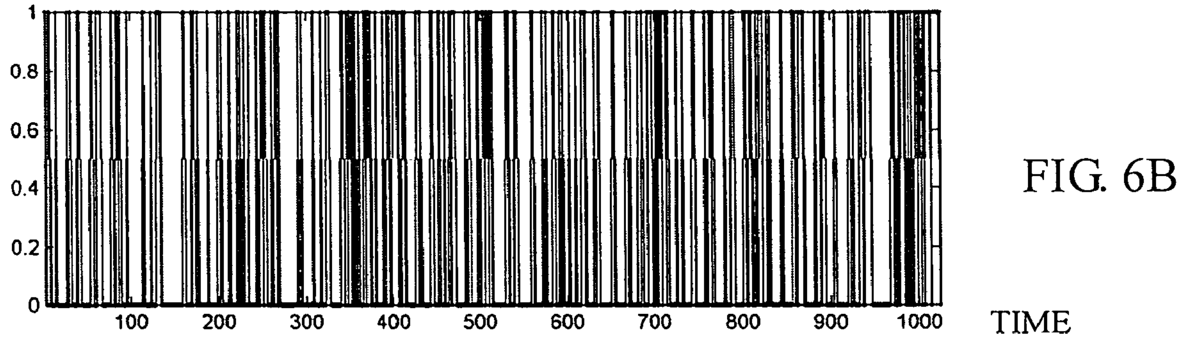

FIG. 6A shows the waveform of the output signal from the digital comparator (10) while using a digital data signal with 512 DC magnitude as its data input signal. In another aspect, FIG. 6B shows the waveform of the output signal from the same digital comparator (10) while using a digital data signal with 299 DC magnitude as its data input signal. According to FIGS. 6A and 6B, the output signals are evenly distributed throughout the time period. Since the 512 DC magnitude of the digital data signal is greater than the 299 DC magnitude of the digital data signal, the pulses of the waveform in FIG. 6A are more clustered than that of the waveform in FIG. 6B.

Figures 7A, 7B:
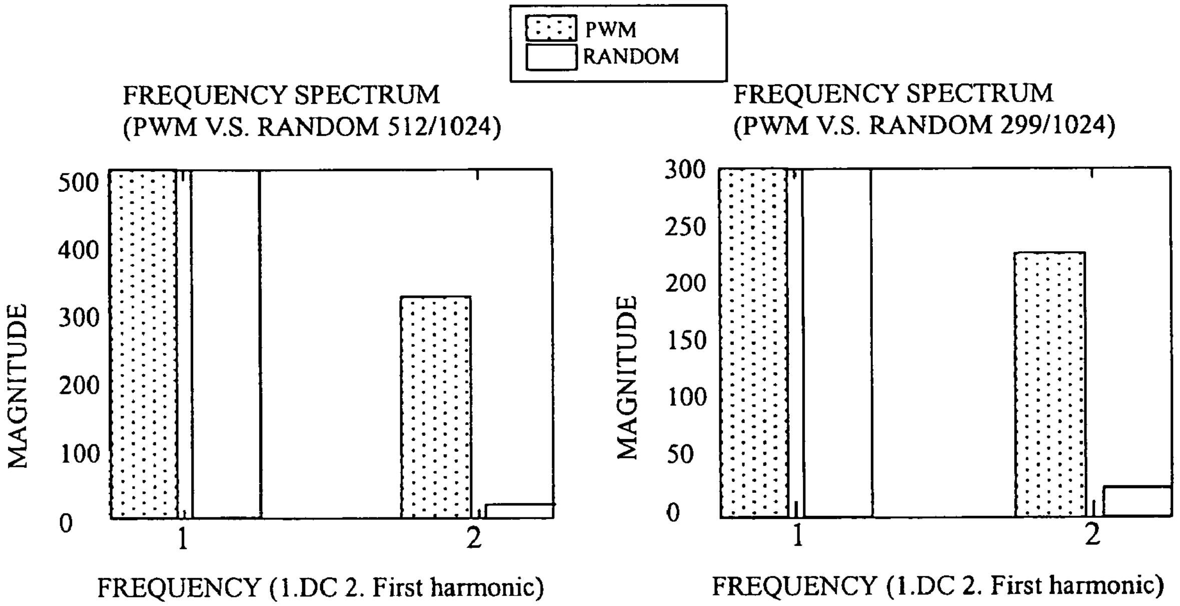
FIGS. 7A and 7B show two comparative outputs of the modified D/A converter and conventional PWM D/A converter when two different digital data signals are input into the D/A converters, in which the DC magnitude of first harmonics for two different digital data signals input into the modified PWM D/A converter are clearly demonstrated.
Figure 8:
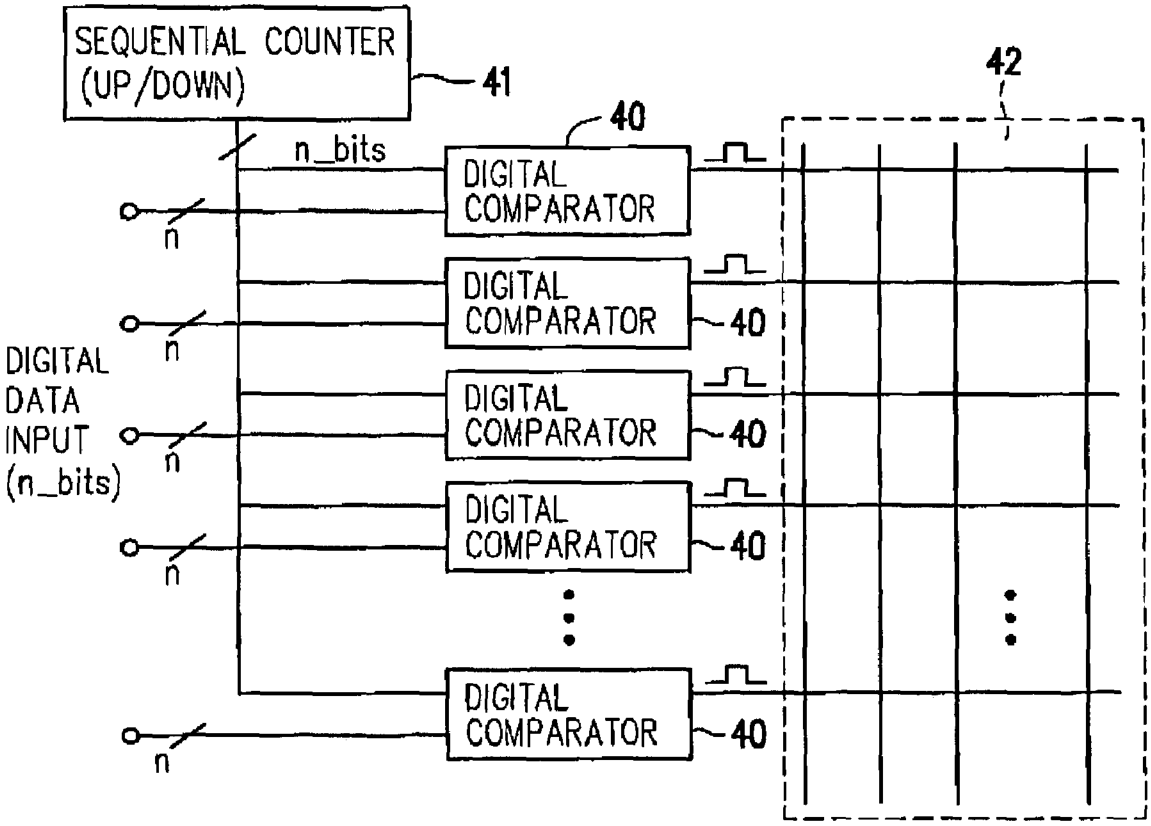
FIG. 8 (PRIOR ART)
FIG. 8 is a block diagram of the architecture of a conventional PWM D/A converter circuit.
Figure 9:
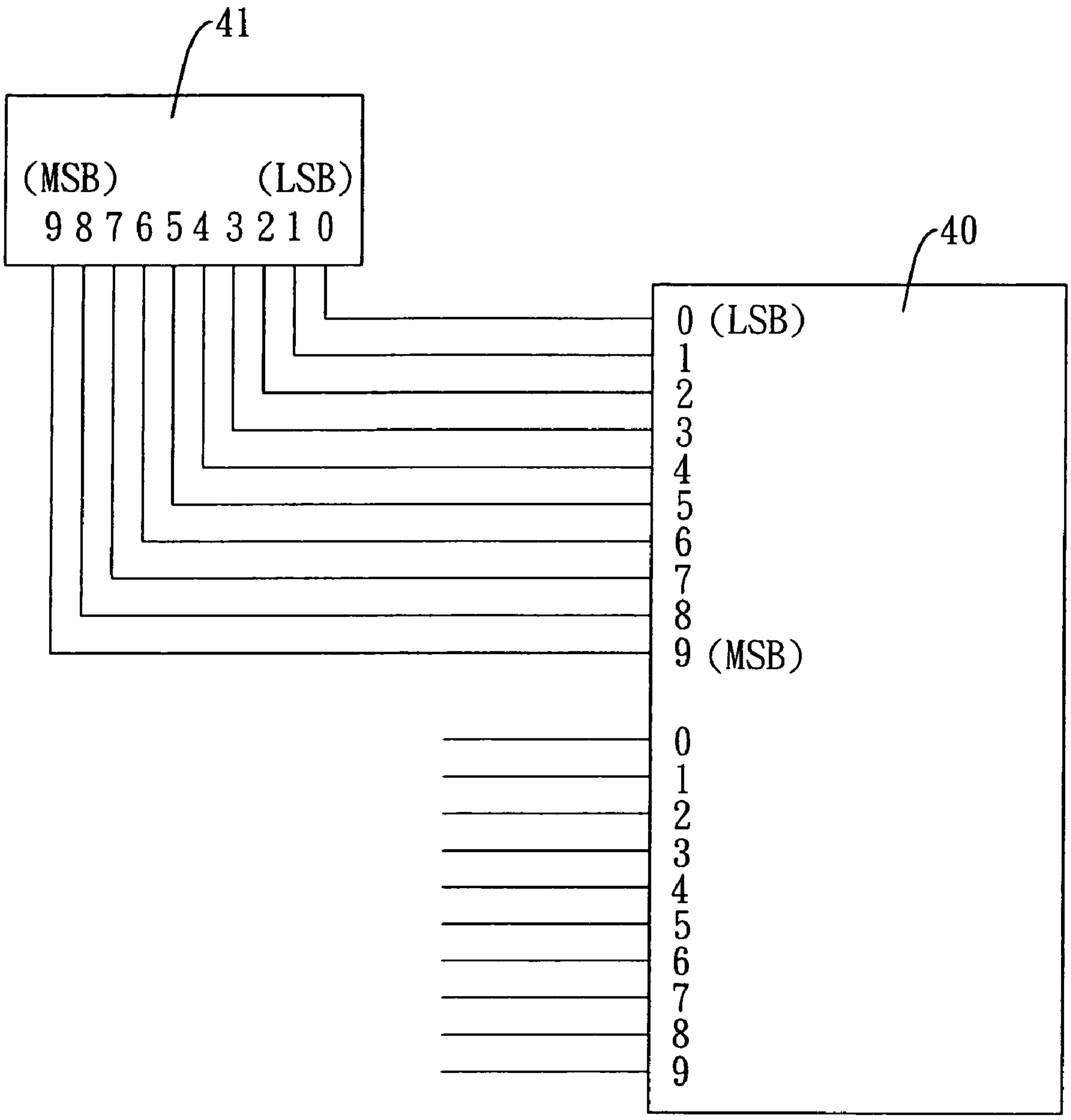
FIG. 9 PRIOR ART
FIG. 9 is a diagram showing the bit line connection from the sequential counter to each digital comparator originally shown in FIG. 8.
Figure 10A:
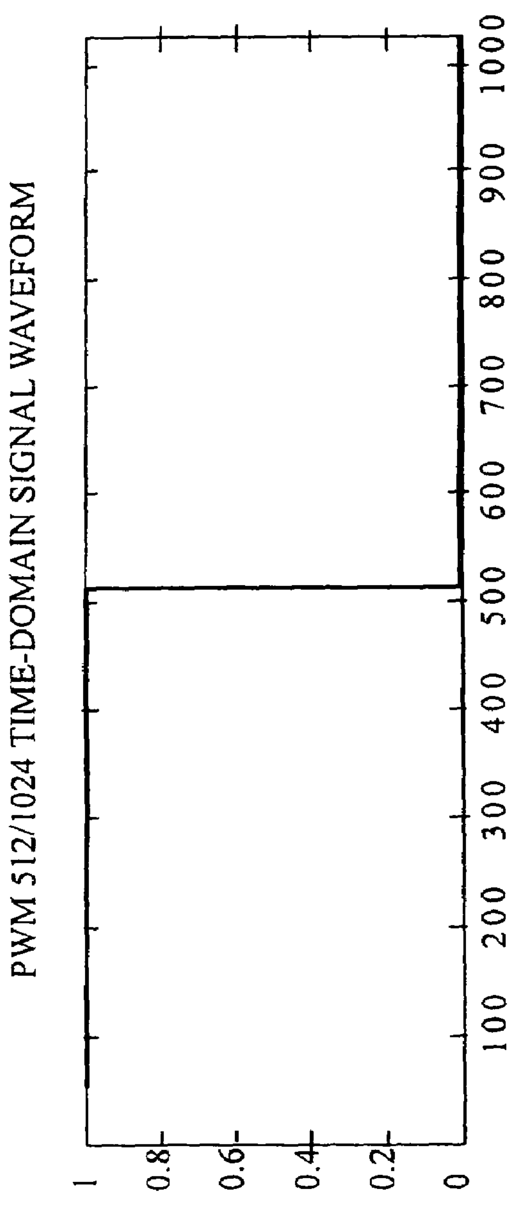
FIG. 10A PRIOR ART
FIGS. 10A and 10B show the output signals of the conventional PWM D/A converter shown in FIG. 8 using the input of two different digital data signals.
Figure 10B:
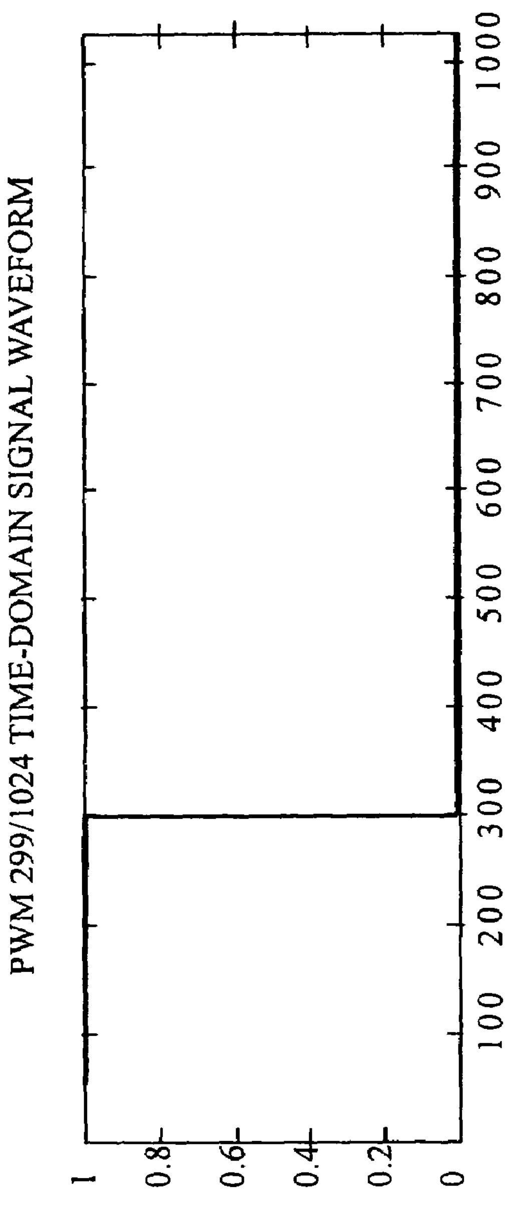
FIG. 10B PRIOR ART
Figure 11:
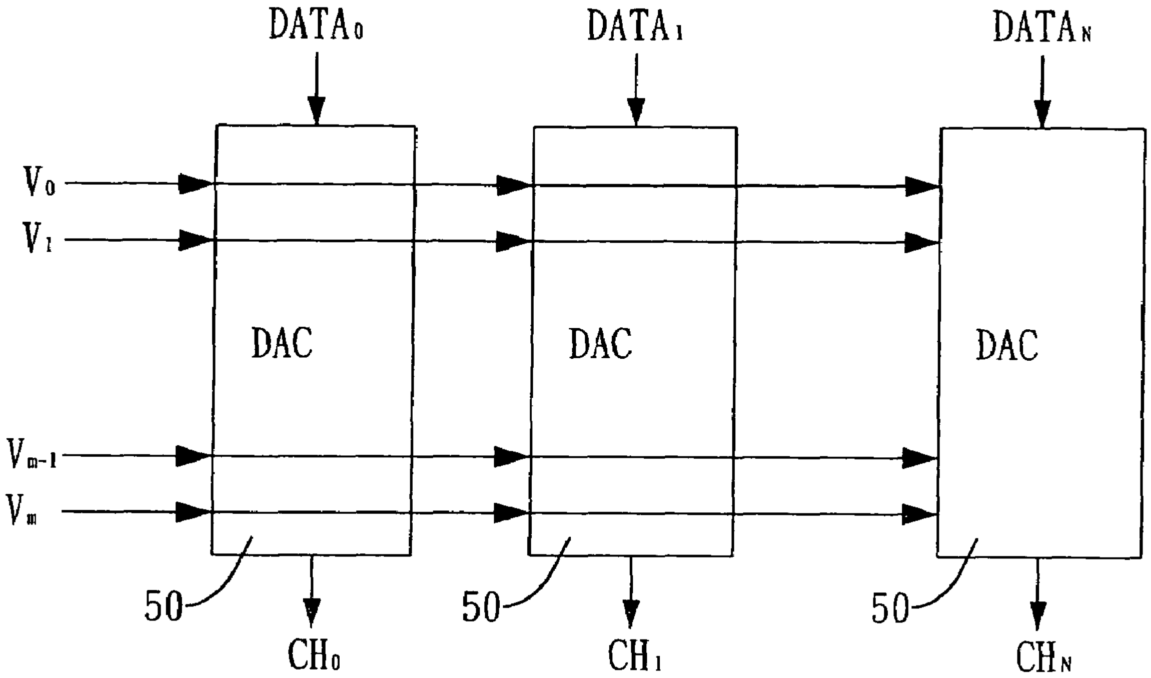
FIG. 11 PRIOR ART
FIG. 11 is a block diagram of the architecture of a sigma-delta D/A converter circuit.
Figure 12:
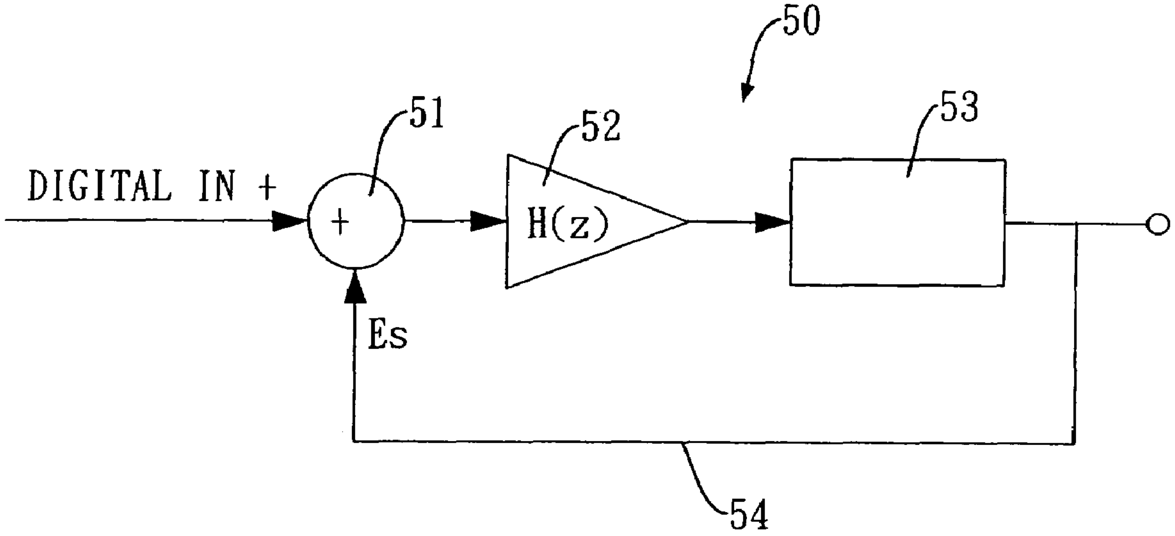
FIG. 12 PRIOR ART
FIG. 12 is a detailed diagram of the structure of the sigma-delta converter originally shown in FIG. 11.
Figure 13A:
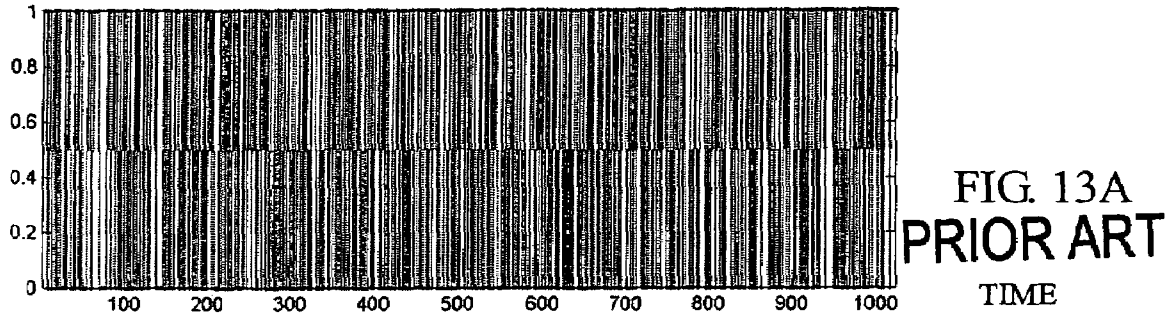
FIG. 13A PRIOR ART
FIGS. 13A and 13B respectively show two time-domain waveforms of the output signals from the sigma-delta converter using the same two digital signals originally shown in FIG. 11.
Figure 13B:
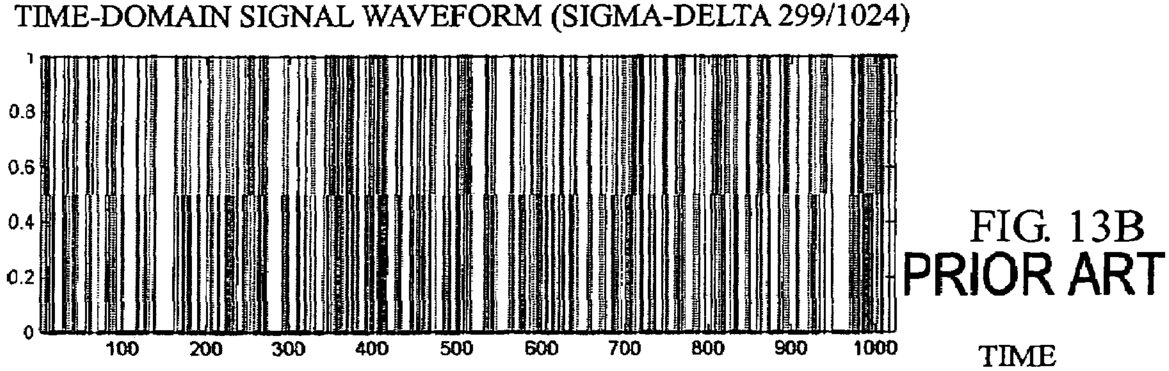
FIG. 13B PRIOR ART
Figures 14A, 14B:
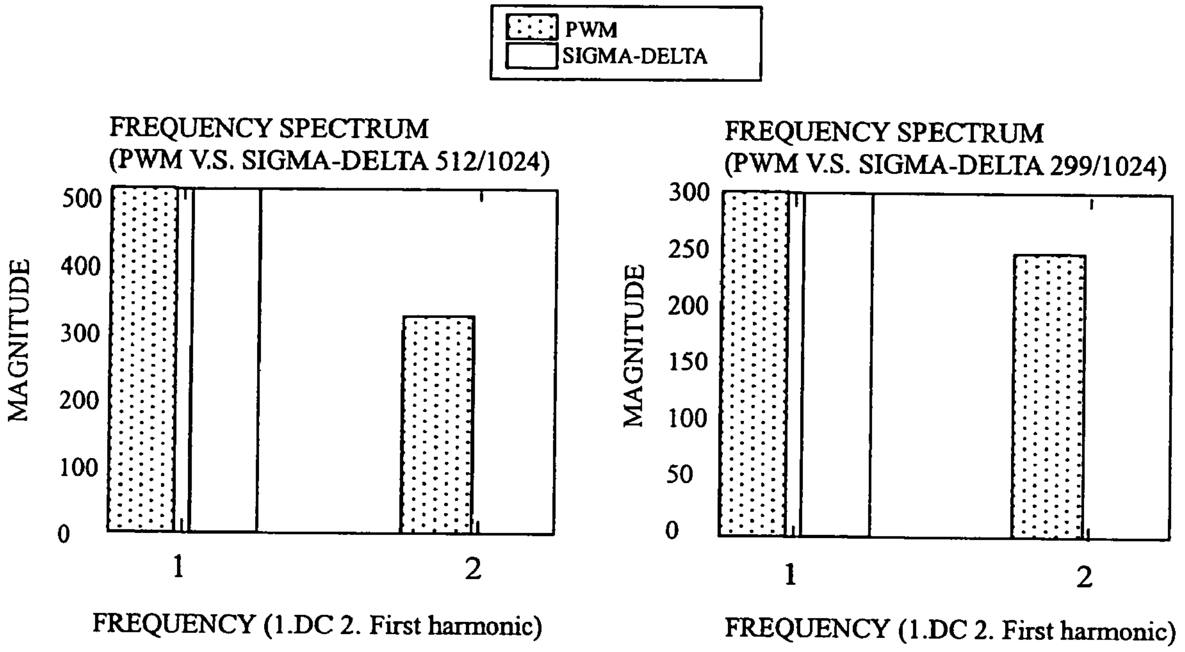
FIG. 14A PRIOR ART
FIG. 14B PRIOR ART
FIGS. 14A and 14B show two comparative outputs of the sigma-delta converter and conventional PWM DAC when two different digital data signals are input into the D/A converters, in which the DC magnitude of first harmonics for input of two different digital data signals are clearly demonstrated.
Figure 15:
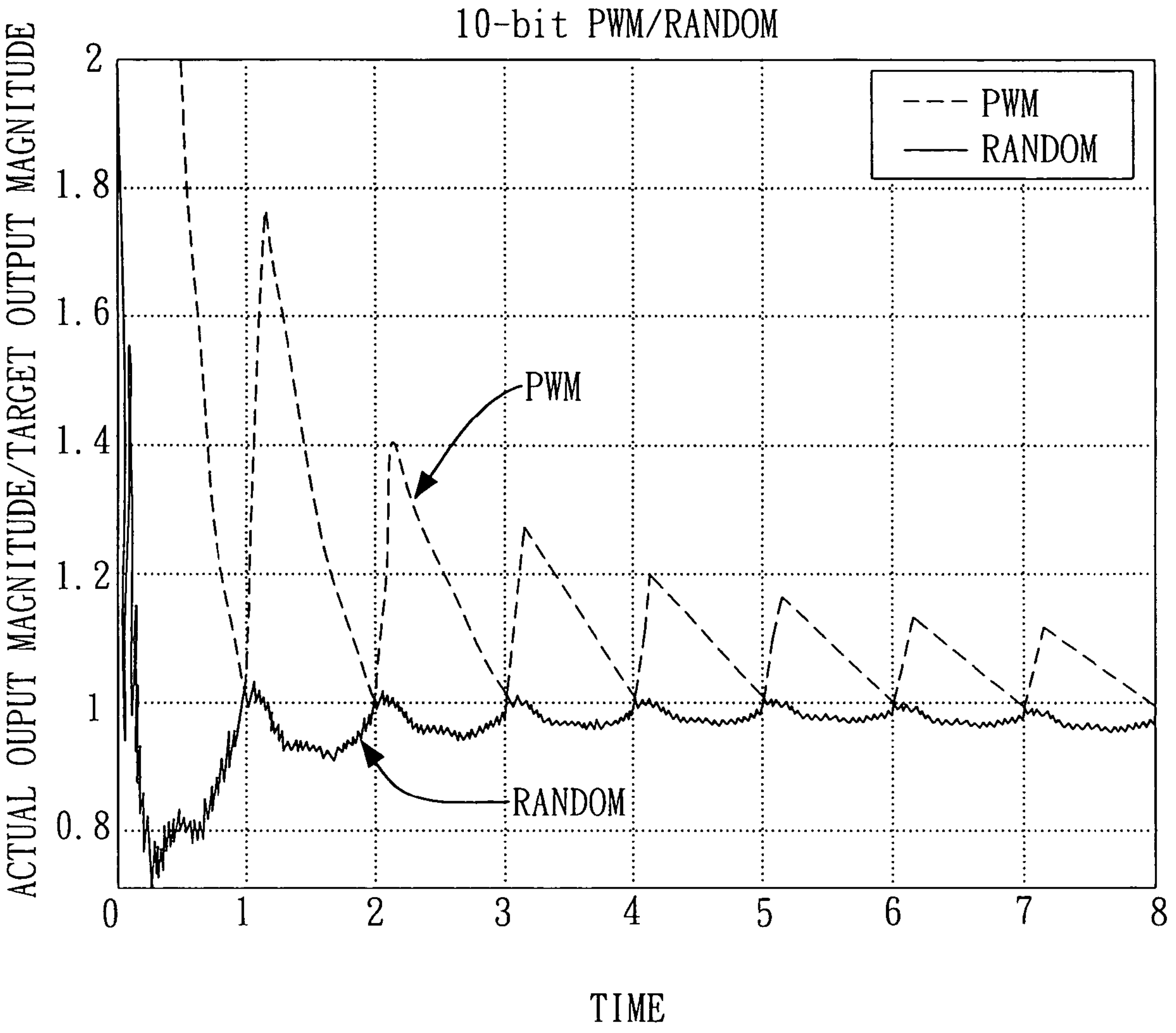
FIG. 15 is a comparative diagram of output accuracy measured from the proposed D/A converter and the conventional D/A converter in a given time period.

Since the high and low voltages of the output signal are evenly distributed throughout the time period, the sampled average DC level in any time period will be closely approximate to the DC level of the input digital data signal. Comparing the present invention with the conventional pulse width modulated (PWM) D/A converter circuit, is shown in FIG. 15, where the horizontal axis represents the time domain, and the vertical axis is the ratio of actual output magnitude over the target output magnitude. It is found that the ratio, which is obtained by the present invention, more closely approximates the target value (ideal rate=1.0). Especially, when the analog signal waveform is not sampled within a complete output cycle, the problem of image distortion as a result of overshoot distortion of the DC level can be prevented. Also, in FIGS. 7A and 7B, it is clearly demonstrated that the first harmonics can be effectively mitigated by the present invention as opposed to the conventional pulse width modulated (PWM) D/A converter circuit. Thus, data imaging free from distortions can be assured.

Figure 3:
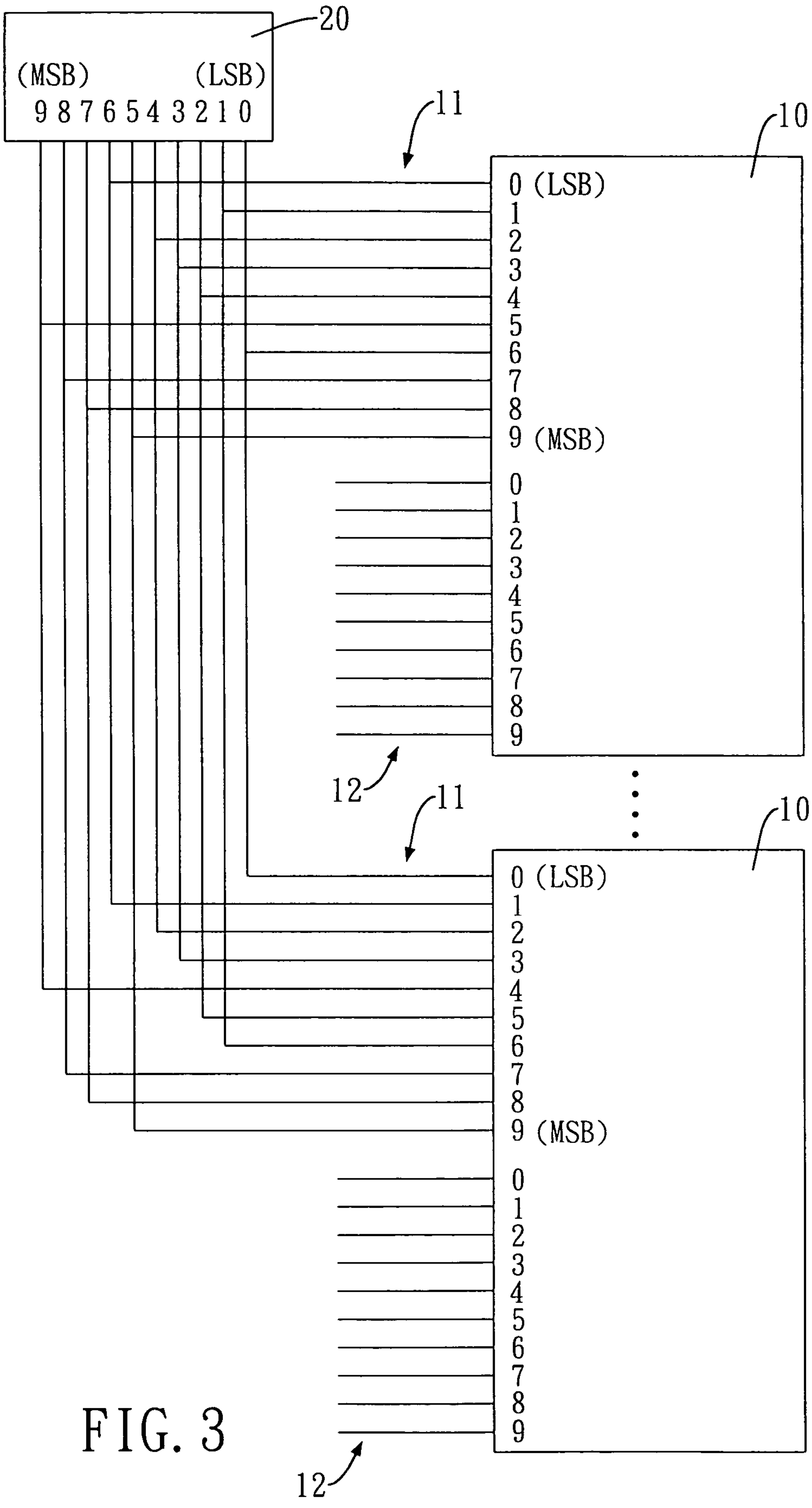
FIG. 3 is a diagram of the architecture of the second embodiment of the invention, showing the bit line connections from the random number generator to each digital comparator in different orders.

With reference to FIG. 3, a second preferred embodiment in accordance with the present invention is slightly different from the first preferred embodiment. The output bit lines of the number generator (20) are non-sequentially connected to the bit lines of the reference input (11) of each digital comparator (10). Moreover, it is noted each connection between the number generator (20) and the digital comparator (10) is different from others so as to prevent simultaneous output switching of the digital comparators (10) if the digital data signals are input to the digital data input (12) of each digital comparator (10).

By changing the connections between the number generator (20) and the digital comparators (10), each digital comparator (10) will receive an independent reference signal, whereby the chance of the digital comparators (10) making a simultaneous switch is considerably reduced. Therefore, in the circuit layout for the digital comparators (10), the bit lines connected between the number generator (20) and the digital comparators (10) are arranged more compactly during the circuit layout without causing electromagnetic interference.

If the reference input (11) of each digital comparator (10) is connected to the output of the number generator (20) in the same order, and all digital comparators (10) receive the same digital signal, the outputs of all digital comparators (10) will be switched simultaneously. Thus, a considerable amount of electromagnetic interference is created. Also, the simultaneous switching in the digital comparators (10) will produce a surge current from the D/A converter circuits due to parasitic inductance collected from adjacent bit lines, which may damage the components. Therefore, connecting the output bit lines of the number generator (20) and the bit lines of the reference input (11) of the digital comparators (10) in different orders is able to prevent simultaneous switching of the digital comparators (10). Therefore, lowering the effect of electromagnetic interference could ensure the precise images shown on the display.

Figure 4A:
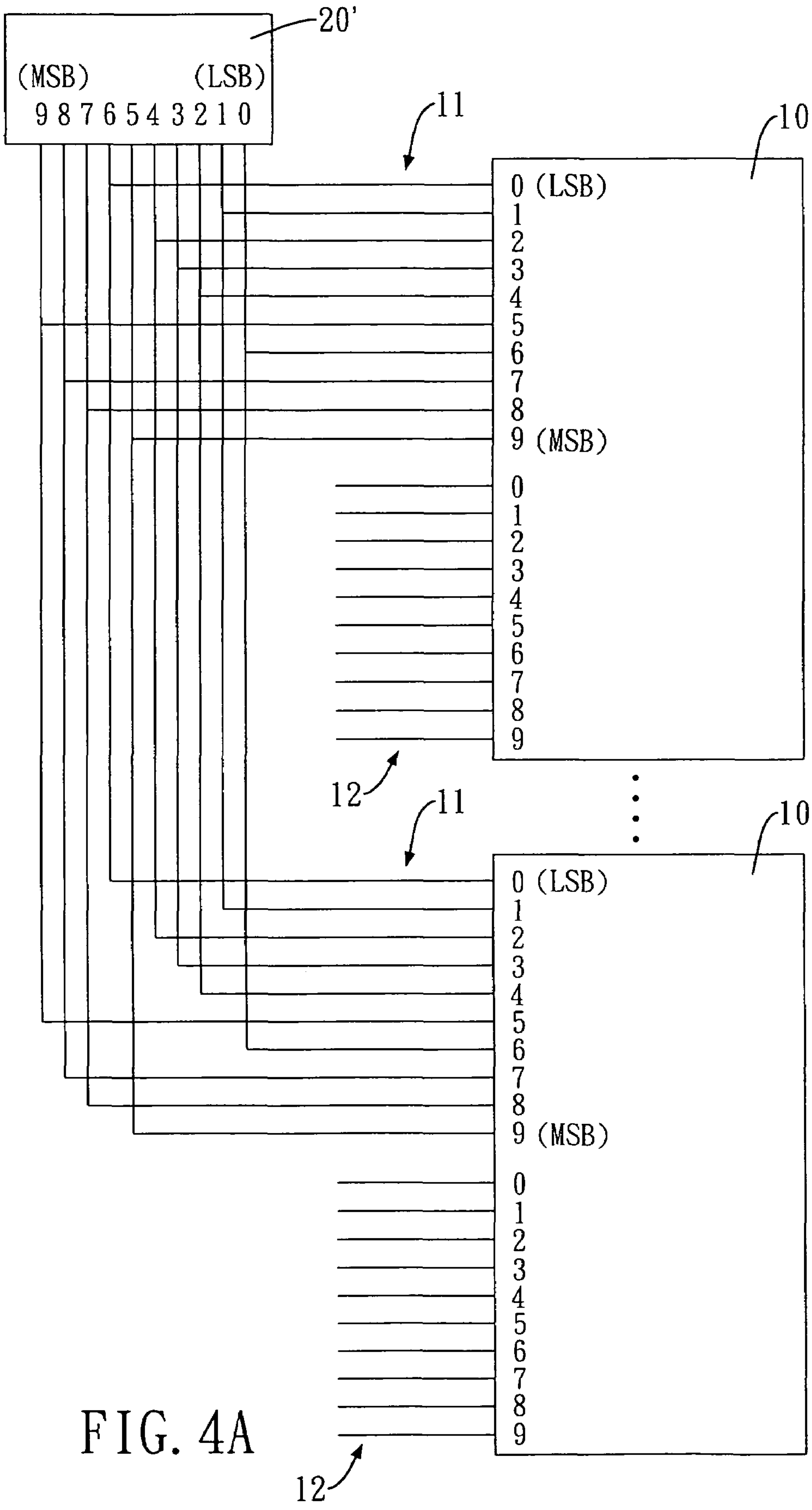
FIG. 4A is a diagram of the architecture of the third embodiment of the invention, showing the bit line connections from the sequential counter to each digital comparator in the same but not sequential order to generate non-sequential reference input.

With reference to FIG. 4A, a third embodiment in accordance with the present invention is designed to correct the output DC level distortion of a conventional PWM D/A converter circuit. The number generator (20) is implemented by a sequential counter (20') with multiple output bits. The output bits of the sequential counter (20') are non-sequentially connected to the bit lines of the reference input (11) of each digital comparator (10). For example, the lowest bit (LSB) of the sequential counter (20') is not correspondingly connected to the lowest bits (LSB) of all the digital comparators (10). Therefore, each digital comparator (10) is provided with an individual non-sequential reference signal derived from the sequence value.

Still referring to FIG. 4A, although each digital comparator (10) is provided with the non-sequential reference signal, it is noted that all digital comparators (10) still receive the same non-sequence reference signal at any given time from the sequential counter (20'). In this condition, the simultaneous switching of digital comparators (10) and the resultant electromagnetic interference will be caused.

Figure 4B:
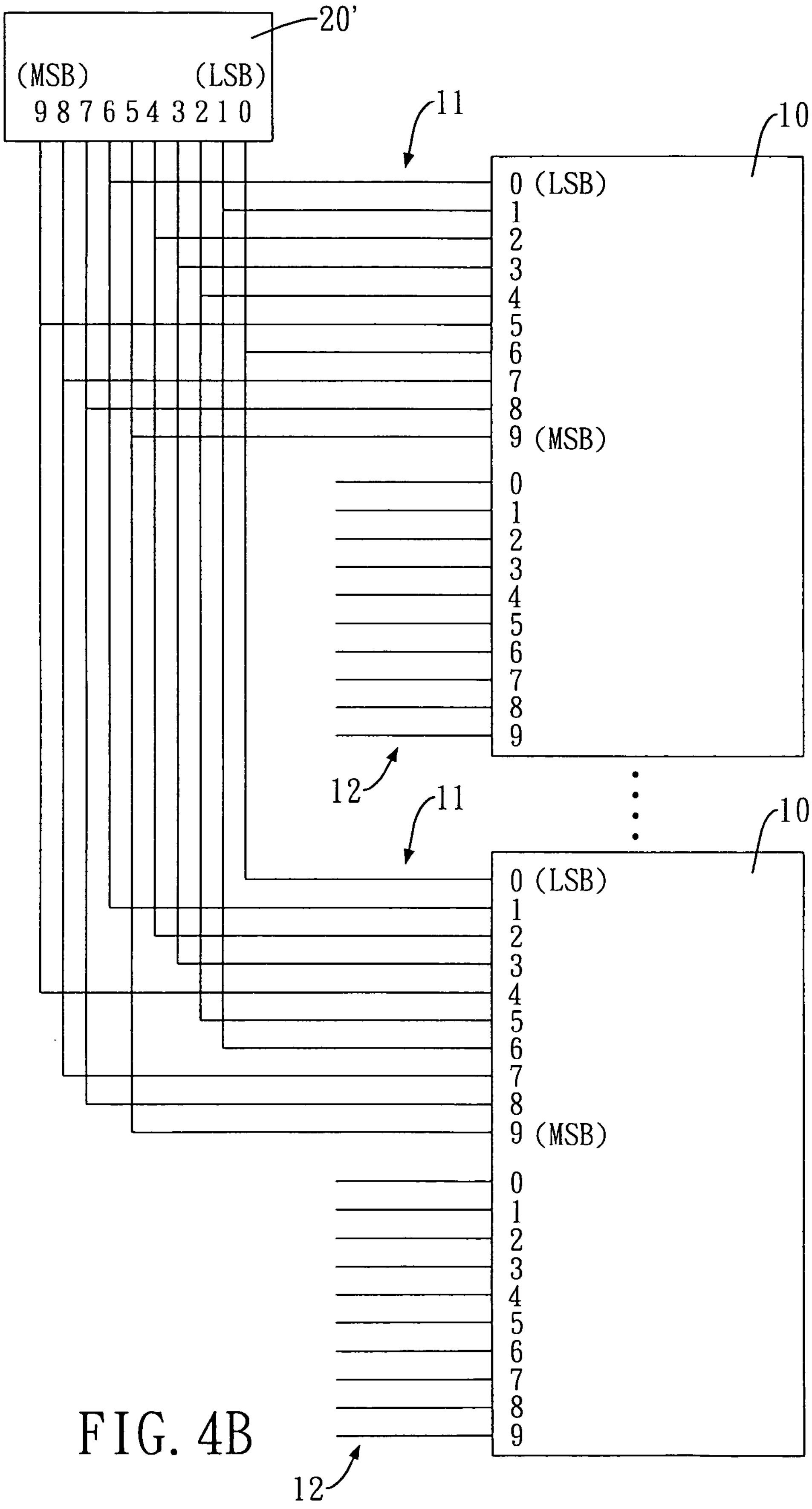
FIG. 4B is a system block diagram of the fourth embodiment of the invention, showing the bit line connections from the counter to each digital comparator in different orders.

Therefore, to overcome the above problem, in the fourth embodiment, as shown in FIG. 4B, the connection order between the output of the sequential counter (20') and the reference input of each digital comparator (10) is independently altered, whereby all digital comparators (10) will not receive the same non-sequence value. Therefore, the chance of simultaneous switching of digital comparators (10) and electromagnetic interference will be considerably reduced.

Figure 5:
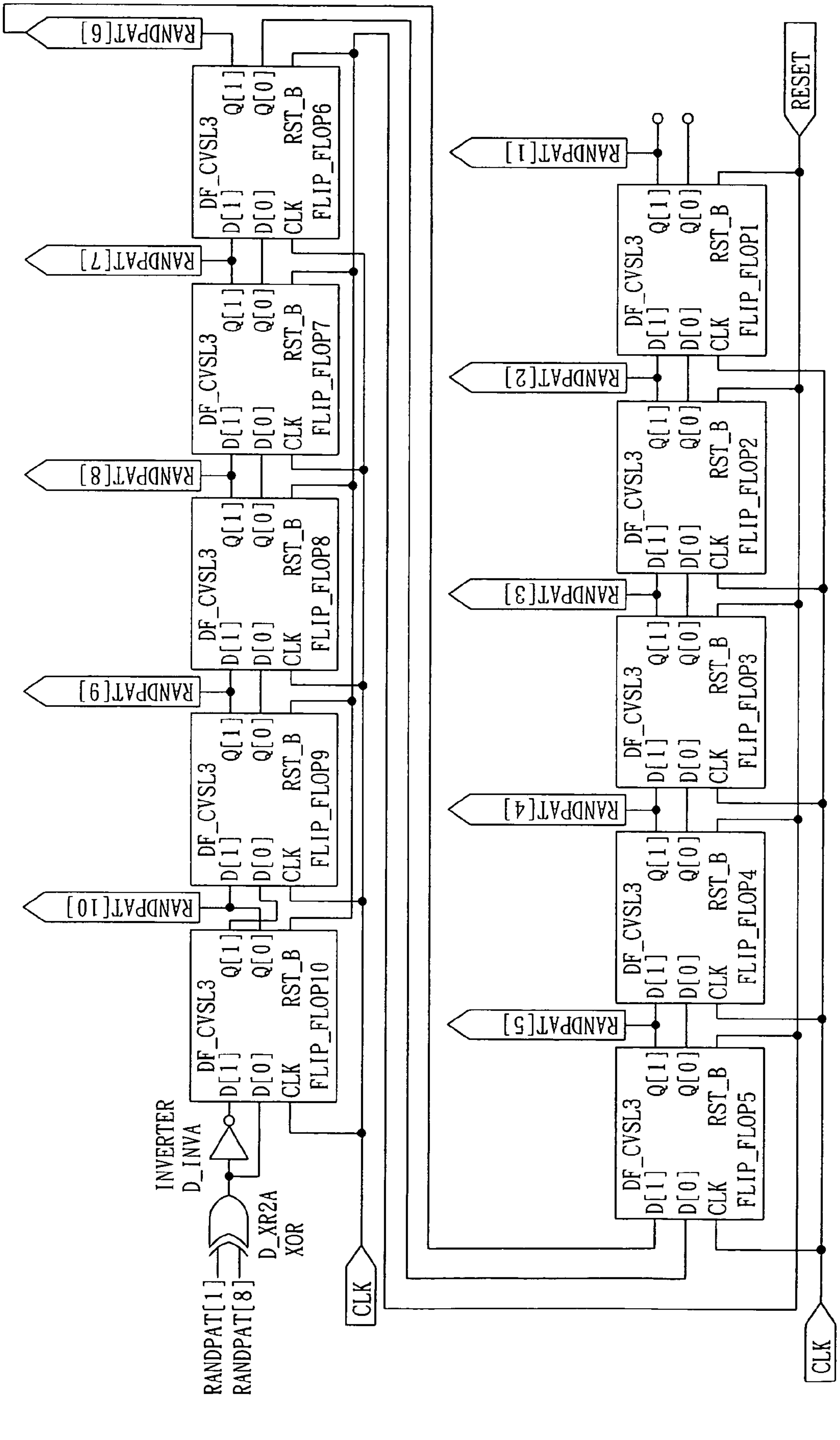
FIG. 5 is a logic circuit diagram for a random number generator used by one of the preferred embodiments.

FIG. 5 shows the pseudo-random logic circuit to form the required random number generator for one of the preferred embodiments. According to the present invention, the 10-bit number generator is implemented by ten D-type flip-flops. The pseudo-random logic circuit for the above random number generation can be expressed in the Verilog™ logic programming language (for example, using a 10-bit random number generator):

```
module RandGen (reset, clk, randpat);
input reset;    *defining reset terminal (reset) as an input
input clk;          *defining clock signal terminal (clk) as another
                    input
```

-continued

```
output [1:10] randpat;   *defining randpat as a 10-bit output
reg [1:10] randpat;      *defining a 10-bit register
reg tmp;                 *defining a temporary register
always @(posedge clk or negedge (reset)
     *to be enabled by rising edge of clock signal, or by falling
edge of reset signal
     begin
          if (!reset) randpat = 'b0000000001';
     *once reset=0, setting the random number
     output to binary 0000000001
          else begin
               tmp = randpat[1] ^ randpat[8];
               randpat = randpat << 1;
               randpat[10] = tmp;
          end       *using exclusive OR on the first bit and the
eighth bit to produce the tenth bit
     end
     endmodule
```

In summary, the present invention is advantageous over the conventional PWM D/A converter circuit for the following reasons:

(1) As the reference input to the digital comparator is based on a non-sequential number, the output signal has the high and low levels evenly distributed over the time period. This can significantly reduce the first harmonic and avoid the overshoot distortion of DC levels when the output signal is not sampled during a complete output cycle.

(2) By changing the order of bit lines connected from the output of the number generator to each digital comparator in a non-sequential order, electromagnetic interference can be considerably suppressed. This technique can also be applied on conventional PWM D/A converter circuits to suppress electromagnetic interference.

(3) As the multiple digital comparators are connected to a number generator, the total component count is less than using the sigma-delta modulation technique. Thus, more circuit space can be saved in the circuit layout, but the image quality is better than conventional PWM DIA converter circuit.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A multi-channel display driver circuit incorporating modified digital-to-analog (D/A) converters, comprising:

a plurality of digital comparators each of which has a digital data input, a reference input with multiple bit lines, and an output that is connected to a corresponding data channel of a display apparatus;

a non-sequential number generator with multiple output bit lines; and a counter having multiple output bit lines and connected to the non-sequential number generator in cascade, together with the non-sequential number generator to produce a non-sequential reference signal outputting to the reference input of each digital comparator, wherein the counter provides a plurality of less significant bits to the digital comparators, and the non-sequential number generator provides a plurality of most significant bits to the digital comparators;

wherein the non-sequential reference signal is represented by the output bit lines of the non-sequential number generator and the counter.

2. The multi-channel display driver circuit incorporating modified D/A converters as claimed in claim 1, wherein the non-sequential number generator is a random number generator to produce random numbers.

3. The multi-channel display driver circuit incorporating modified D/A converters as claimed in claim 1, wherein the bit lines of the reference input of each digital comparator are sequentially connected to the output bit lines of the of the non-sequential number generator and the counter.

4. The multi-channel display driver circuit incorporating modified D/A converters as claimed in claim 1, wherein the bit lines of the reference input of each digital comparator are non-sequentially connected to the output bit lines of the non-sequential number generator and the counter, whereby each digital comparator receives the same non-sequential reference signal.

5. A multi-channel display driver circuit incorporating modified digital-to-analog (D/A) converters, comprising:

a plurality of digital comparators, each of which has a digital data input, a reference input with multiple bit lines, and an output that is connected to a corresponding data channel of a display apparatus; and a non-sequential number generator with multiple output bit lines, producing a non-sequential reference signal outputting to the reference input of each digital comparator;

wherein the non-sequential reference signal is represented by the output bit lines of the non-sequential number generator, the bit lines of the reference input of each digital comparator are non-sequentially connected to the output bit lines of the non-sequential number generator, and each connection between the digital comparator and the output bit lines is different from others, whereby each digital comparator receives a unique reference signal and compares the unique reference signal and an independent data input signal which is represented by a digital data input with multiple bit lines of each comparator.

6. The multi-channel display driver circuit incorporating the modified D/A converters as claimed in claim 5, wherein the non-sequential number generator comprises:

a random number generator to produce random numbers.

7. The multi-channel display driver circuit incorporating the modified D/A converters as claimed in claim 6, wherein the non-sequential number generator further comprises:

a counter having multiple output bit lines and connected to the non-sequential number generator in cascade, together with the non-sequential number generator to produce a non-sequential reference signal outputting to the reference input of each digital comparator.

* * * * *